United States Patent
Kato et al.

(10) Patent No.: US 6,826,053 B2
(45) Date of Patent: Nov. 30, 2004

(54) ELECTRONIC DEVICE

(75) Inventors: Mitsuhide Kato, Sabae (JP); Koji Tanaka, Takefu (JP); Tetsuo Taniguchi, Shiga-ken (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 10/408,064

(22) Filed: Apr. 5, 2003

(65) Prior Publication Data

US 2003/0189814 A1 Oct. 9, 2003

(30) Foreign Application Priority Data

| Apr. 5, 2002 | (JP) | 2002-103470 |
| Jul. 26, 2002 | (JP) | 2002-218350 |
| Jan. 21, 2003 | (JP) | 2003-011869 |

(51) Int. Cl.[7] .............................................. H05K 7/20
(52) U.S. Cl. ................ 361/715; 361/818; 361/800; 361/720; 257/704; 174/35 R; 174/51
(58) Field of Search .................. 361/715, 816, 361/818, 760, 720, 752, 730; 257/704; 174/51, 35 R

(56) References Cited

U.S. PATENT DOCUMENTS 5,706,579 A * 1/1998 Ross ............................ 29/840
5,909,057 A * 6/1999 McCormick et al. ........ 257/704
6,188,578 B1 * 2/2001 Lin et al. ..................... 361/717

FOREIGN PATENT DOCUMENTS

| JP | 05-047968 | 2/1993 |
| JP | 07-022768 | 1/1995 |
| JP | 08-017853 | 1/1996 |
| JP | 08-167680 | 6/1996 |
| JP | 10-209649 | 8/1998 |

* cited by examiner

*Primary Examiner*—David Martin
*Assistant Examiner*—Hung S. Bui
(74) *Attorney, Agent, or Firm*—Keating & Bennett, LLP

(57) ABSTRACT

An electronic device includes a wiring substrate, an electronic component mounted on the wiring substrate by soldering, and a case fixed to the wiring substrate so as to cover the electronic component. The case is fixed to the wiring substrate via soldering, and the case and the electronic component are adhered to each other with an adhesive resin supplied through an opening provided in the upper surface of the case. The adhesive resin is applied so as not to contact the wiring substrate such that interface separation does not occur between the adhesive resin and the wiring substrate even when the solder for mounting the electronic component on the wiring substrate is melted and expanded in a solder reflow process. As a result, the generation of short circuiting between terminal electrodes of the electronic component, which is caused by the solder flowing in the portion of the interface separation, is prevented.

19 Claims, 8 Drawing Sheets

ELECTRONIC DEVICE

BACKGROUND OF THE INVENTION

1. Field of the Invention

The present invention relates to electronic devices including a wiring substrate and at least two units provided thereon, and more particularly, to an improvement in the strength for fixing a metal case and surface mount electronic components to the wiring substrate or for fixing a plurality of surface mount electronic components thereto.

2. Description of the Related Art

High-frequency electronic devices, such as RF devices for mobile phones and wireless communication, include a wiring substrate and surface mount electronic components mounted thereon via soldering.

FIG. 8 is a schematic cross-sectional view of a related electronic device 101, which is of interest to the present invention.

The electronic device 101 is a hybrid electronic device including a wiring substrate 102. The wiring substrate 102 is a multilayer ceramic substrate. Although not shown in the figure, on end surfaces of the periphery or the bottom surface of the wiring substrate 102, several terminal electrodes are provided, and on the top surface of the wiring substrate 102, several conductive lands are provided.

At least two surface mount electronic components 103 and 104 are mounted on the top surface of the wiring substrate 102 by soldering. One electronic component 103 is an IC chip component and is soldered to the conductive lands provided on the top surface of the wiring substrate 102 with several solder bumps 105 provided therebetween. The other electronic component 104 is a chip component, such as a capacitor, inductor, or quartz oscillator, and is soldered to the conductive lands provided on the top surface of the wiring substrate 102 with solder fillets 106 formed via soldering.

In the electronic device 101 having the structure described above, a case (not shown) may be fixed to the wiring substrate 102 so as to cover the electronic components 103 and 104.

However, the electronic device 101 shown in FIG. 8 has the following problems.

First, when impact is applied to the wiring substrate 102 due to a fall, bending, or other external force, at least one of the electronic components 103 and 104 mounted on the wiring substrate 102 may fall therefrom or be damaged.

In addition, when the size of the electronic component mounted on the wiring substrate 102 is increased, such as an IC chip component, or when the number of electronic components mounted on the wiring substrate 102 is increased, the size of the wiring substrate 102 must be increased. In addition, since the electronic device 101 has been increasingly required to have a smaller height, the thickness of the wiring substrate 102 must be decreased. Accordingly, damage, such as breakage, caused by external forces are more likely to occur in the wiring substrate 102.

In addition, when the solder bumps 105 provided for the electronic component 103 are formed of eutectic solder, when the electronic device 101 is mounted as a module component on an appropriate motherboard (not shown) via a solder reflow process or other suitable soldering method, the temperature applied when the device is mounted may be higher than that at which the eutectic solder is melted in many cases. In this case, when the solder bumps 105 are melted, the electronic component 103 may move with respect to the wiring substrate 102, and in the worst case, electrical short circuiting caused by the solder will occur between the adjacent conductive lands which are to be connected to the respective solder bumps 105, thereby producing electronic devices 101 which must be rejected.

In addition, in an electronic device provided with a case, when the case is made, for example, of a metal, soldering is frequently performed to fix the case to the wiring substrate. However, due to insufficient strength obtained by soldering, in some cases, the case falls off or is removed from the wiring substrate.

A technique which is of interest to the present invention is disclosed in Japanese Unexamined Patent Application Publication Nos. 5-47968 and 8-17853 in which a resin is provided in the case so as to contact the wiring substrate, and the electronic component thereon is covered with the resin. Since the resin is in contact with the case, the resin serves as an adhesive for adhering the case and the wiring substrate to each other, and hence, the strength of fixing the case to the wiring substrate is increased by the resin.

However, in the structure disclosed in Japanese Unexamined Patent Application Publication Nos. 5-47968 and 8-17853, since the resin covers the electronic component, the solder applied for mounting the electronic component on the wiring substrate is also covered with the resin, and the structure described above may cause the following problems.

That is, the electronic device described above is mounted on a mounting substrate such as a motherboard so that the wiring substrate is brought into contact therewith. In this step, when a solder reflow process is used, the temperature for solder reflow may be higher than the melting point of the solder used for mounting the electronic component to the wiring substrate. In this case, since the solder used for mounting the electronic component is expanded by melting, or volatile components of the solder is expanded, stress is applied to the resin covering the electronic component, the adhesion strength between the resin and the wiring substrate is decreased, and as a result, interface separation therebetween may occur.

Accordingly, when interface separation occurs, the melted solder flows in the portion at which the interface separation occurs, and as a result, the solder causes short circuiting between different terminal electrodes of the electronic component mounted on the wiring substrate, resulting in short-circuiting defects.

The short circuiting defects described above are more likely to occur when the resin is arranged in the case so as to cover the electronic component, and when the resin is not provided in the case, the defects might be prevented. However, when the resin is not provided in the case as described above, the fixing strength of the case to the wiring substrate is reduced.

SUMMARY OF THE INVENTION

To overcome the problems described above, preferred embodiments of the present invention provide an electronic device which increases the fixing strength of an electronic component to a wiring substrate, reduces the occurrences of damage thereto, and prevents undesirable movement of the electronic component in a solder reflow process.

In addition, the electronic device according to preferred embodiments of the present invention prevents short circuiting defects caused by a resin provided in a case while increasing the fixing strength of a case to the wiring substrate.

An electronic device according to a preferred embodiment of the present invention includes a wiring substrate, a first unit and a second unit which are mounted on the wiring substrate, and an adhesive resin which adheres the first unit to the second unit, wherein the adhesive resin is not in contact with the wiring substrate. Accordingly, the adhesive resin mechanically integrates the first unit with the second units via adhesion.

The first unit may preferably include at least one surface mount electronic component which is mounted on the wiring substrate via soldering, the second unit preferably includes a case fixed to the wiring substrate so as to cover the electronic component. The adhesive resin is preferably provided between the top surface of the electronic component and the bottom surface of the top wall of the case.

The adhesive resin increases the fixing strength of the case to the wiring substrate with the electronic component provided therebetween. In addition, since the adhesive resin is arranged so as not to contact the wiring substrate, interface separation between the wiring substrate and the resin is prevented even when solder used for mounting the electronic component on the wiring substrate is melted and expanded, and since the solder does not flow in the portion at which the interface separation occurs, short circuiting is prevented. That is, the adhesive resin is preferably arranged so as not to be in contact with solder for connecting the surface mount electronic component or the case to the wiring substrate.

After the electronic component is mounted, in order to easily supply the adhesive resin between the electronic component and the case, an opening is preferably provided in the top wall of the case for supplying the adhesive resin from the outside.

To prevent foreign materials from intruding into the case through this opening, and to avoid limiting a suction position to which a suction nozzle of a mounting machine is applied in a mounting step, the opening is preferably sealed with the adhesive resin.

In addition, to prevent interference with marking on the top wall of the case, the opening is preferably provided at a position spaced from the center of the top wall of the case toward the peripheral side thereof.

In the electronic device of preferred embodiments of the present invention, when the first unit includes a plurality of the surface mount electronic components, the adhesive resin is provided across at least the plurality of electronic components.

When the top surface of the electronic component has at least a resin portion, and the adhesive resin is provided on resin portion for adhesion, the adhesion strength of the adhesive resin is further increased.

In preferred embodiments of the present invention, the case is preferably made of metal. In this case, the case is fixed to the wiring substrate via soldering.

The electronic device of preferred embodiments of the present invention preferably further includes a third unit disposed between a sidewall of the case and the wiring substrate. In this case, even when the position of the case fixed to the wiring substrate is shifted, to prevent the case from damaging the third unit (in particular, surface mount electronic component), the sidewall of the case and the third unit are preferably spaced from one another.

In the electronic device of preferred embodiments of the present invention, when the first unit includes a plurality of electronic components, and the plurality of electronic components has top surfaces having different areas from each other, the adhesive resin is preferably provided on at least the top surface of the electronic component having the largest top surface area. This increases the adhesion area of the adhesive resin to the electronic component, and the adhesive resin does not undesirably flow down to the wiring substrate.

In addition, when the first unit includes a plurality of electronic components, and the plurality of electronic components have different heights from each other, the adhesive resin is preferably provided on at least the top surface of the electronic component having the greatest height. This decreases the amount of the adhesive resin required to adhere the electronic component to the case, and the adhesive resin does not undesirably flow down to the wiring substrate.

In addition, in the electronic device of preferred embodiments of the present invention, when the electronic component includes a first and a second electronic component, and the adhesive resin includes a first adhesive resin for adhering the first electronic component to the case and a second adhesive resin for adhering the first electronic component to the second electronic component, the first adhesive resin and the second adhesive resin may have different compositions. In an uncured state, the first adhesive resin preferably has a low viscosity and a low thixotropic index as compared to that of the second adhesive resin. The reasons for this are that the first adhesive resin is likely to spread along the top surface of the first electronic component, and the second adhesive resin is unlikely to flow down to the wiring substrate.

In another preferred embodiment of the present invention, the first unit includes a first surface mount electronic component, the second unit includes a second surface mount electronic component, and the first and the second surface mount electronic components are mounted on the wiring substrate via soldering, and hence, the electronic device of this preferred embodiment of the present invention defines a hybrid electronic component. The adhesive resin mechanically integrates the first electronic component with the second electronic component via adhesion.

As described above, one of the first electronic component and the second electronic component adhered to each other via the adhesive resin preferably has the largest planar area of the electronic components mounted on the wiring substrate. The electronic component having the largest planar area may be an IC chip component.

As described above, when the adhesive resin is provided on the electronic component having the largest planar area, the other electronic component adhered thereto with the adhesive resin described above preferably has the second largest planar area of the electronic components mounted on the wiring substrate.

In the electronic device of preferred embodiments of the present invention, when a third surface mount electronic component is further mounted on the wiring substrate via soldering, and the second and the third electronic components are provided at two opposing sides of the first electronic component opposing each other, the first electronic component is preferably adhered to the second and the third electronic components with the adhesive resin provided therebetween.

In the second preferred embodiment of the present invention, a case fixed to the wiring substrate is further provided so as to cover the electronic components. In the case described above, the adhesive resin is also preferably adhered to the case. In addition, on the top wall of the case, an opening is preferably provided for supplying the adhesive resin from the outside.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
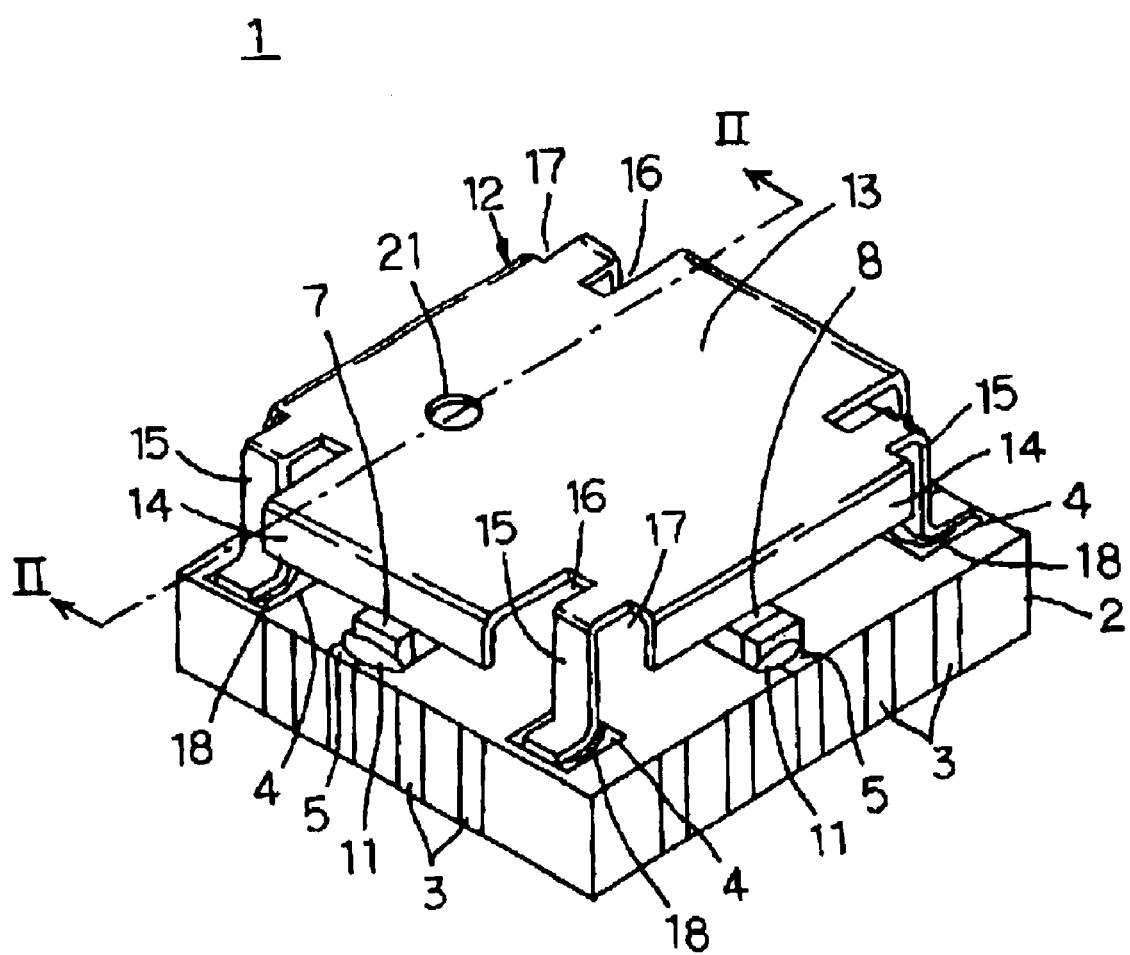
FIG. 1 is a perspective view showing an electronic device of a first preferred embodiment according to the present invention.
Figure 2:
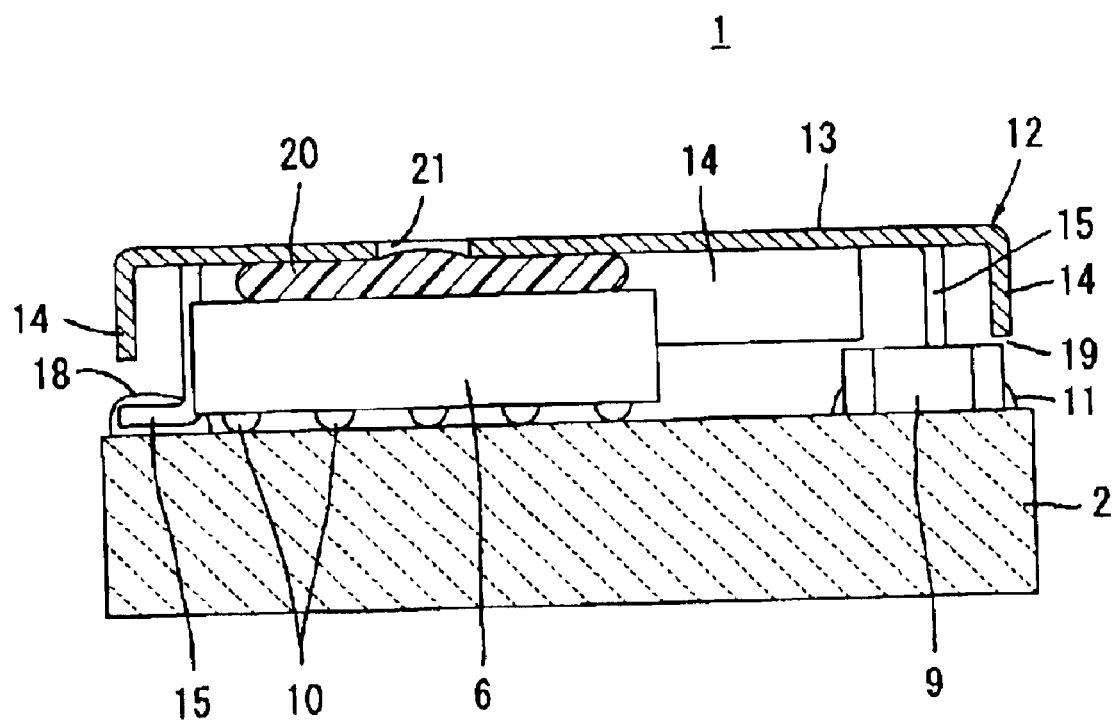
FIG. 2 is a cross-sectional view taken along the line II—II in FIG. 1.

FIG. 1 is a perspective view showing an electronic device 1 of a first preferred embodiment according to the present invention, and FIG. 2 is a cross-sectional view taken along the line II—II in FIG. 1.

The electronic device 1 shown in FIG. 1 is used, for example, as a high-frequency electronic device such as an RF device in a mobile phone or a wireless communication device.

The electronic device 1 includes a wiring substrate 2. Although not shown in detail in FIG. 1, the wiring substrate 2 is, for example, a multilayer ceramic electronic substrate including passive elements, such as capacitors, inductors, resistors, filters, and delay lines, and wire conductors. As shown in FIG. 1, on the end surfaces at the periphery of the wiring substrate 2, several terminal electrodes 3 are provided, and on the top surface of the wiring substrate 2, several conductive lands 4 and 5 are provided.

On the top surface of the wiring substrate 2, several surface mount electronic components 6, 7, 8, and 9 are mounted via soldering. Among the electronic components mounted on the wiring substrate 2, only the typical components are shown in the figure.

The electronic component 6 shown in FIG. 2 is an IC chip component, such as a radio frequency IC (RFIC), a baseband (BB) IC, or a memory, and is soldered to the wiring substrate 2 via several solder bumps 10. In addition, the electronic components 7 and 8 shown in FIG. 1 and the electronic component 9 shown in FIG. 2 are surface mount chip components, such as capacitors, inductors, or quartz oscillators. In FIGS. 1 and 2, solder fillets 11 used for soldering these electronic components 7 to 9 are shown.

In addition, on the bottom surface of the wiring substrate 2, electronic components may be mounted whenever necessary. In this case, in the bottom surface of the wiring substrate 2, a cavity (recess portion) is provided, and the electronic components may be mounted in the cavity.

A case 12 is fixed to the wiring substrate 2 so as to cover the electronic components 6 to 9 described above. The case 12 is made of metal. In this preferred embodiment, the case 12 is preferably formed by processing a metal plate and includes a top wall 13, four sidewalls 14, and four foot-portions 15. Notches 16 and 17 are provided at both sides of each of the foot-portions 15 and are used to facilitate forming the foot-portions 15.

The foot-portions 15 of the case 12 are used for fixing the case 12 to the wiring substrate 2. That is, the foot-portions 15 are soldered to the conductive lands 4 provided on the wiring substrate 2 with solder 18, and hence the case 12 is fixed to the wiring substrate 2.

The sidewalls 14 of the case 12 are each configured such that the height thereof does not reach the upper surface of the wiring substrate 2. In particular, as shown in FIG. 2, when the electronic component 9 is disposed between the sidewalls 14 and the wiring substrate 2, each of the sidewalls 14 and the electronic component 9 have a space 19 provided therebetween. The reasons for this are as follows.

When the foot-portions 15 of the case 12 are soldered to the conductive lands 4 with the solder 18 by a reflow solder process, the solder 18 is melted in the reflow solder process, and as a result, the case 12 may move along the surface of the wiring substrate 2. When the space 19 is not provided, the sidewall 14 and the electronic component 9 are brought into contact with each other. When the solder 18 is solidified such that the case 12 is fixed to the wiring substrate 2, the electronic component 9 may be scratched, and breakage or chipping thereof may occur. In addition, when the case 12 is placed on the electronic component 9, the soldering strength between the case 12 and the wiring substrate 2 may be decreased. The space 19 prevents the problems described above.

When the electronic device 1 is a high-frequency device, the dimensions and shape of the sidewall 14, and in particular, the dimension of the space 19 is designed such that electromagnetic waves in currently used frequency bands will not leak, and such that sufficient shielding properties are ensured.

Furthermore, in the electronic device 1, as shown in FIG. 2, the electronic component 6 and the case 12 are adhered to each other with an adhesive resin 20. As shown in FIG. 2 the adhesive resin 20 is applied, for example, onto only the top surface of the electronic component 6, so as not to reach the wiring substrate 2. In this step, as long as the adhesive resin 20 does not reach the wiring substrate 2, the adhesive resin 20 may be applied so as to extend onto the side surfaces of the electronic component 6.

The adhesive resin 20 is applied after the electronic components 6 to 9 are mounted on the wiring substrate 2 and after the case 12 is fixed thereto. Hence, in the top wall 13 of the case 12, an opening 21 is provided for easily supplying the adhesive resin 20 from the outside. Accordingly, the adhesive resin 20 is supplied in an uncured state in the case 12 through the opening 21, for example, by a dispenser. As the adhesive resin 20, a thermosetting resin such as an epoxy resin is used and is cured by heating. The viscosity of the adhesive resin 20 in an uncured state is selected such that the adhesive resin 20 easily flows through the relatively small opening 21 and spreads along the top surface of the electronic component 6, but does not flow down along the side surfaces thereof.

As the adhesive resin 20 described above, for example, a material having the following composition and properties (viscosity and thixotropic index) is preferably used.

(Composition)

| | |
|---|---|
| Bisphenol-based epoxy resin | 10 to 20 wt % |
| Anhydride-based curing agent | 10 to 15 wt % |
| Curing promoter (phenolic resin) | 3 to 5 wt % |
| Filler (silica) | 60 to 65 wt % |
| Modifier (silicone resin) | 3 to 7 wt % |
| (Properties) | |
| Viscosity (25° C.) | 40 to 70 Pa · s |
| Thixotropic Index (B8H type viscometer) | 1.0 to 1.4 |

As shown in FIG. 2, the opening 21 is preferably sealed with the adhesive resin 20. This prevents foreign materials from intruding into the case 12 through the opening 21.

In addition, the opening 21 is preferably provided at a position spaced from the center of the top wall 13 of the case 12 toward the peripheral side thereof. Hence, an area in which marking of a tradename or other suitable mark is performed, for example, by laser is provided on the top wall 13 of the case 12.

In addition, by providing the opening 21 at a position other than the center of the top wall 13, this opening 21 can be used as a mark indicating the directionality of the electronic device 1. In this case, when the adhesive resin 20 includes a pigment such as carbon, the opening 21 is colored in black or other suitable color by the adhesive resin 20, the difference in color tone between the opening 21 and the adhesive resin 20 is more visible.

In this preferred embodiment, under the opening 21, the electronic component 6 is preferably provided. However, it is not necessary that the center of the top surface of the electronic component 6 be aligned with the opening 21, and even when the electronic component 6 is mounted on the center of the wiring substrate 2, the arrangement of which is different from that shown in the figure, the position of the opening 21 is preferably shifted from the center of the top wall 13.

In addition, when the electronic component 6 is an IC chip component, resin packaging is generally performed thereon. When the electronic component 6 has a top surface including at least a resin portion, as described above, since the adhesive resin 20 is applied to this resin portion for adhesion, the adhesion strength between the adhesive resin 20 and the electronic component 6 is further improved.

As shown in the FIG. 1, when a plurality of electronic components, i.e., the electronic components 6 to 9, is mounted on the wiring substrate 2, and the areas of the top surfaces of the electronic components 6 to 9 are different from each other, the adhesive resin 20 is preferably applied on the top surface of the electronic component 6 having the largest top surface area. As a result, the adhesive resin 20 is less likely to flow down along the side surfaces of the electronic component 6.

In addition, as shown in the FIG. 1, when the plurality of the electronic components 6 to 9 have different heights, the adhesive resin 20 is preferably applied to the top surface of the electronic component 6 having the greatest height. As a result, even when the amount of adhesive resin 20 is small, the electronic component 6 and the case 12 are securely adhered to each other. In addition, when the amount of the adhesive resin 20 is reduced, the adhesive resin 20 is less likely to flow down along the side surfaces of the electronic component 6.

As described above, according to the first preferred embodiment described with reference to FIGS. 1 and 2, by adhering the electronic component 6 and the case 12 to each other with the adhesive resin 20, the fixing strength of the case 12 to the wiring substrate 2 is greatly improved. Accordingly, the case 12 is much less likely to fall off of the wiring substrate 2, due to impact caused by, for example, dropping a product provided with this electronic device 1.

In addition, by providing the adhesive resin 20, the gaps between the case 12 and the electronic component 6 and the wiring substrate 2 are maintained constant, and for example, in a property inspection step and selection step for the electronic device 1, and in a step of mounting and soldering the electronic device 1 onto a mounting substrate such as a motherboard, variations of the gaps are minimized and prevented, thereby preventing variations in the properties of the electronic device 1.

Since the adhesive resin 20 does not contact the wiring substrate 2, when this electronic device 1 is mounted on an appropriate motherboard by a solder reflow process or other suitable soldering method, the movement of melted solder generated when the solder bumps 10 are remelted is not restricted by the adhesive resin 20, and as a result, electrical short circuiting generated between different terminals of the electronic component 6, which is caused by the restriction of the movement of the solder as described above, is prevented.

In addition, fixing of the case 12 to the wiring substrate 2 is performed by the adhesive resin 20 adhering the electronic component 6 to the case 12 and by the solder 18 bonding the foot-portions 15 to the wiring substrate 2. Accordingly, even when the bonding strength between the foot-portions 15 and the wiring substrate 2 is decreased, since a fixing strength equal to or greater than a predetermined strength is ensured for the case 12, the areas of the bonding portion between the foot-portions 15 and the conductive lands 4 are decreased. As a result, the area at which circuit elements other than the conductive lands 4 are disposed is increased, and hence miniaturization of the electronic device 1 is achieved.

In addition, since the opening 21 is provided in the case 12, after the electronic components 6 to 9 are mounted on the wiring substrate 2, and the case 12 is fixed thereto, the adhesive resin 20 is applied. Accordingly, before a step of applying the adhesive resin 20, when the electronic device 1 is rejected as defective, the expensive electronic component 6, such as an IC chip component, can be removed from the wiring substrate 2 for reuse.

Figure 3:
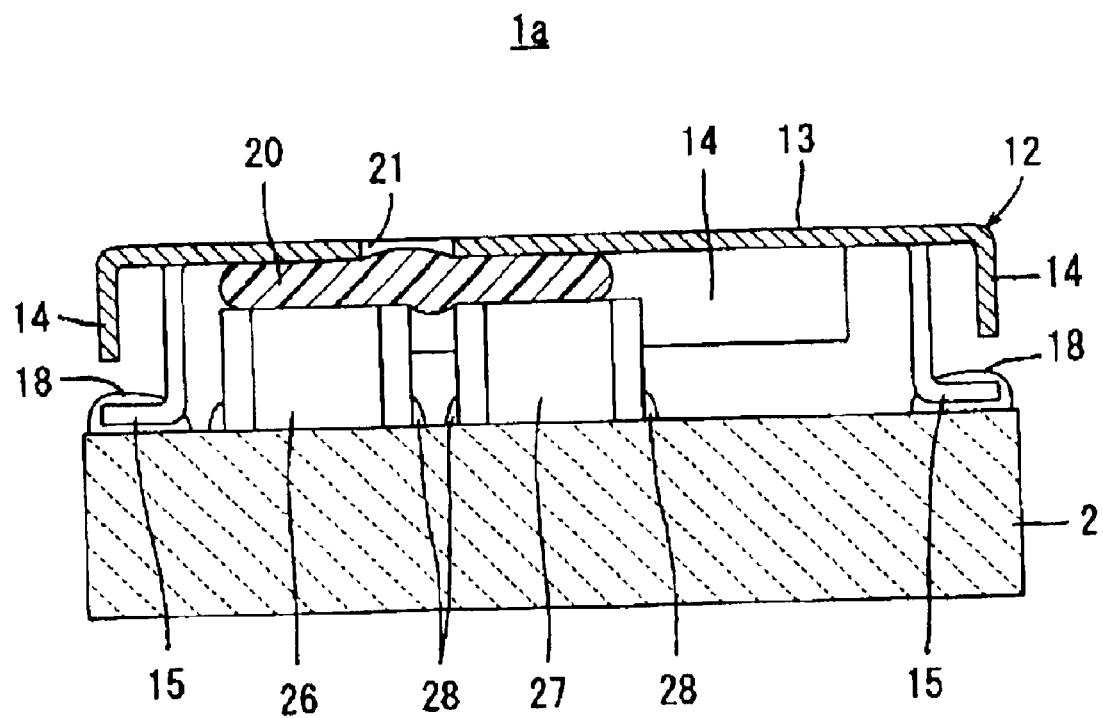
FIG. 3 is a cross-sectional view showing an electronic device of a second preferred embodiment according to the present invention, the view corresponding to that in FIG. 2.

FIG. 3 is a view showing an electronic device 1a of a second preferred embodiment according to the present invention and is a view corresponding to that in FIG. 2. In FIG. 3, the same reference numerals of the elements in FIG. 2 designate the equivalent elements, and descriptions thereof are omitted.

In FIG. 3, two electronic components 26 and 27 are mounted on the wiring substrate 2. The electronic components 26 and 27 are, for example, surface-mounted chip components, such as capacitors, inductors, or quartz oscillators. Solder fillets 28 shown in FIG. 3 are used to solder the electronic component 26 and 27 to the conductive lands provided on the wiring substrate 2.

In this preferred embodiment, the adhesive resin 20 is applied across a plurality of electronic components, such as, the two electronic components 26 and 27, and the rest of the structure is substantially equivalent to that in the first preferred embodiment.

As shown in FIG. 3, since the adhesive resin 20 is applied across the electronic components 26 and 27, the positional relationship therebetween is fixed. Hence, in a solder reflow process in which this electronic device 1a is mounted on a surface mounting substrate, such as a motherboard, even when the solder which forms the solder fillets 28 is melted, the electronic components 26 and 27 are prevented from moving independently, and as a result, variations in the properties of the electronic device 1a are prevented from occurring.

In addition, since the two electronic components 26 and 27 are mechanically integrated, even when one of the electronic components 26 and 27 has a weak bonding strength to the wiring substrate 2, the electronic components 26 and 27 are prevented from falling from the wiring substrate 2 and being damaged by external impact due to the fall, bending, or other external forces on the electronic device.

Figure 4:
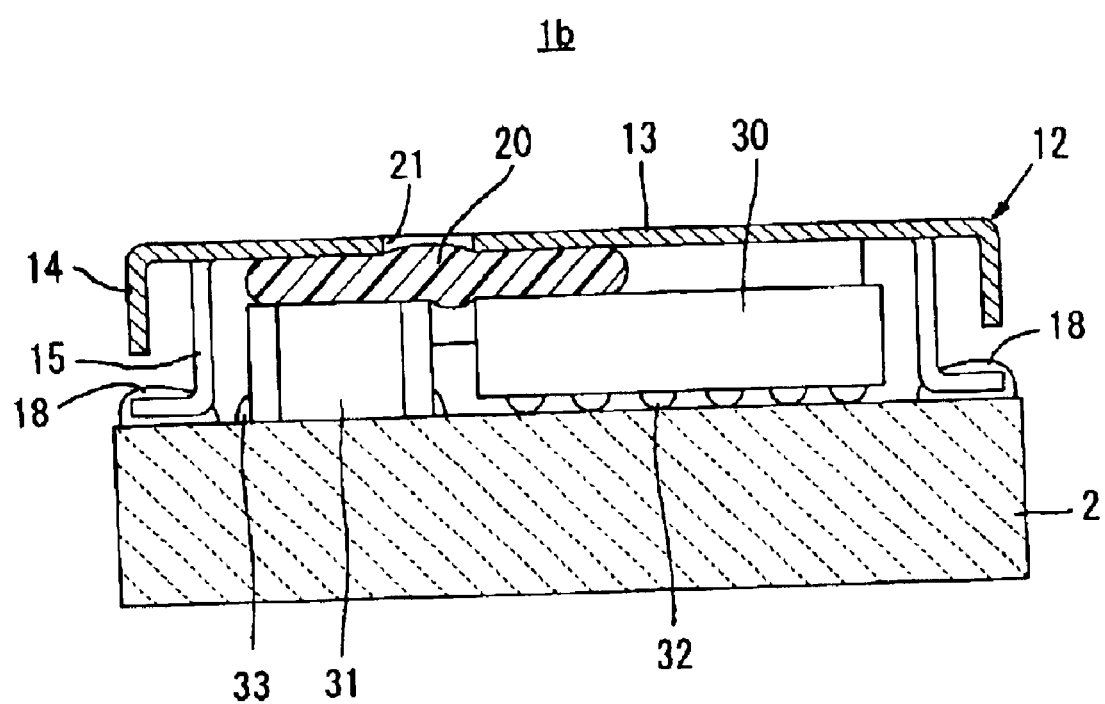
FIG. 4 is a cross-sectional view showing an electronic device of a third preferred embodiment according to the present invention, the view corresponding to that in FIG. 2.

FIG. 4 is view showing an electronic device 1b of a third preferred embodiment according to the present invention and is a view corresponding to that in FIG. 2. In FIG. 4, the same reference numerals of the elements in FIG. 2 designate the equivalent elements, and descriptions thereof are omitted.

In FIG. 4, two electronic components 30 and 31 mounted on the wiring substrate 2 are shown. One electronic component 30 is an IC chip component similar to the electronic component 6 shown in FIG. 2, and is soldered to the conductive lands provided on the wiring substrate 2 with several solder bumps 32 provided therebetween. The other electronic component 31 is a chip component which surface-mounted similar to the electronic component 26 or 27 shown in FIG. 3. A solder fillet 33 is shown in FIG. 4. The electronic component 31 is soldered to conductive lands formed on the wiring substrate 2 via the solder fillet 33.

In this preferred embodiment, the adhesive resin 20 is applied across a plurality of electronic components, such as the two electronic components 30 and 31. The rest of the structure is substantially equivalent to that in the second preferred embodiment described above, and the same advantages are achieved.

In addition, in this preferred embodiment, since the electronic components 30 and 31, which are mechanically integrated, each have a relatively large planar area, a reinforcing structure for increasing the bending strength of the wiring substrate 2 is provided. Hence, damage such as breakage of the wiring substrate 2, which is caused by impact applied thereto due to a fall, bending, or other external force on the electronic device 1b, is reliably prevented.

Furthermore, according to this preferred embodiment, the following effects are also achieved.

When the solder bumps 32 provided for the electronic component 30 are made of eutectic solder, and the electronic device 1b is mounted on an appropriate motherboard by a solder reflow process, the solder bumps 32 may be melted such that the electronic component 30 moves with respect to the wiring substrate 2, and in the worst case, electrical short circuiting may occur by solder between adjacent conductive lands connected to the respective solder bumps 32.

However, when high temperature solder is used for the solder fillet 33 for soldering the other electronic component 31 to the wiring substrate 2, the solder fillet 33 does not melt, and hence the electronic component 31 reliably maintains its position with respect to the wiring substrate 2. As a result, the electronic component 30 fixed to the electronic component 31 with the adhesive resin 20 is reliably maintained in its position with respect to the wiring substrate 2.

Figure 5:
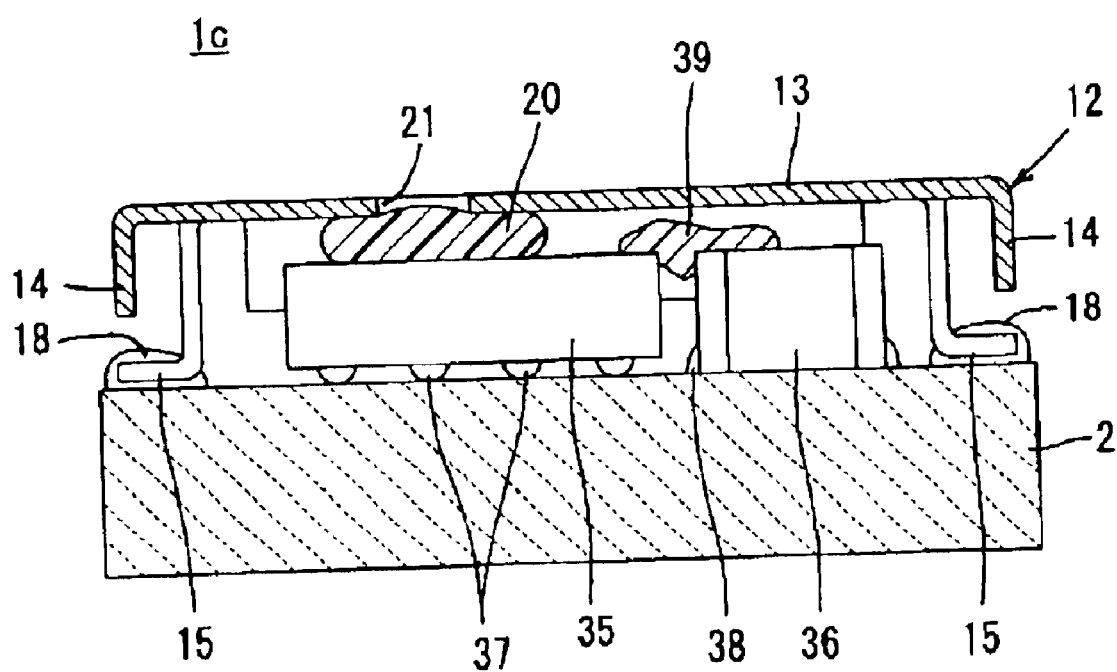
FIG. 5 is a cross-sectional view showing an electronic device of a fourth preferred embodiment according to the present invention, the view corresponding to that in FIG. 2.

FIG. 5 is a view showing an electronic device 1c of a fourth preferred embodiment according to the present invention and is a view corresponding to that in FIG. 2. In FIG. 5, the same reference numerals of the elements in FIG. 2 designate the equivalent elements, and descriptions thereof are omitted.

In FIG. 5, two electronic components 35 and 36 mounted on the wiring substrate 2 are shown. One electronic component 35 is an IC chip component similar to the electronic component 30 shown in FIG. 4, and is soldered to the conductive lands provided on the wiring substrate 2 with several solder bumps 37 provided therebetween. The other electronic component 36 is a chip component to be surface-mounted similar to the electronic component 31 shown in FIG. 4. A solder fillet 38 is shown in FIG. 5. The electronic component 36 is soldered to conductive lands formed on the wiring substrate 2 via the solder fillet 38.

In this preferred embodiment, the adhesive resin 20 is supplied through the opening 21 provided in the top wall 13 of the case 12 so as to adhere the electronic component 35 to the case 12. In addition, before the case 12 is provided on the wiring substrate 2, an adhesive resin 39 is applied across the two electronic components 35 and 36. These adhesive resins 20 and 39 are applied so as not to contact the wiring substrate 2.

In this preferred embodiment, the adhesive resins 20 and 39 have compositions that are different from each other. More particularly, compared to the adhesive resin 39, the adhesive resin 20 in an uncured state preferably has a low viscosity and a small thixotropic index. Thus, the adhesive resin 20 easily spreads along the top surface of the electronic component 35, and the adhesive resin 39 is unlikely to flow down to the wiring substrate 2. For example, the viscosity and the thixotropic index of the adhesive resin 39 are both preferably at least twice those of the adhesive resin 20.

The adhesive resin 20 is preferably made of a material having the particular composition and properties described above (viscosity and thixotropic index), and the adhesive resin 39 is preferably made of a material having the following composition and properties (viscosity and thixotropic index).

(Composition)

| | |
|---|---|
| Bisphenol-based epoxy resin | 12 to 18 wt % |
| Anhydride-based curing agent | 10 to 15 wt % |
| Filler (silica) | 70 to 80 wt % |
| Other additives | 1 to 5 wt % |
| (Properties) | |
| Viscosity (25° C.) | 94 to 170 Pa · s |
| Thixotropic Index (B8H type viscometer) | 2.8 to 3.3 |

According to this fourth preferred embodiment, similar advantages to those of the second and the third preferred embodiments are obtained, and when the compositions of the adhesive resins 20 and 39 are different from each other, the adhesive resins 20 and 30 having favorable properties are obtained.

Figure 6A:
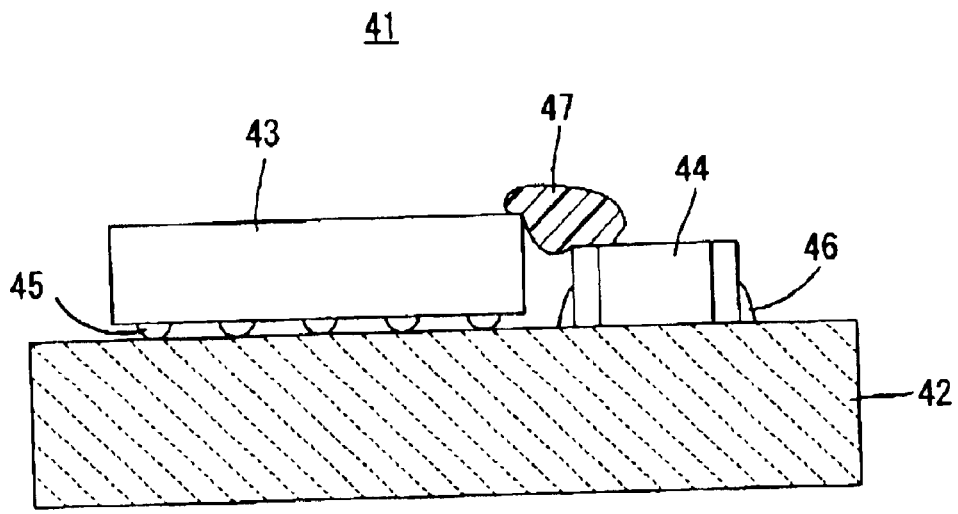
FIG. 6A is a cross-sectional view schematically showing an electronic device of a fifth preferred embodiment according to the present invention.
Figure 6B:
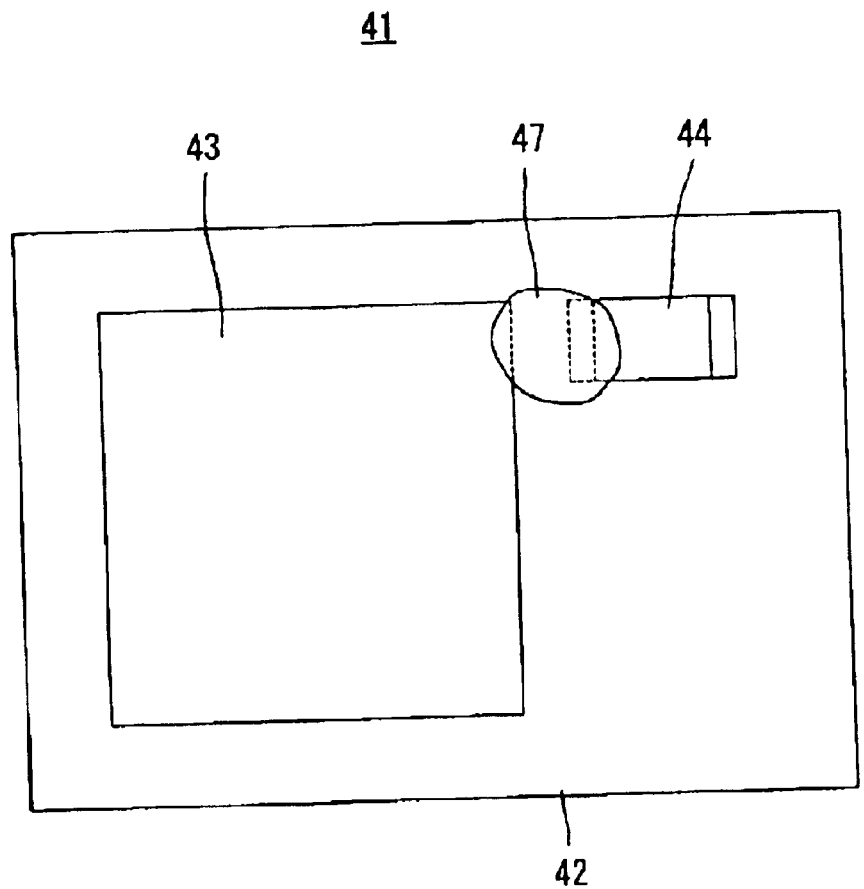
FIG. 6B is a plan view schematically showing the electronic device of the fifth preferred embodiment according to the present invention.
Figure 8:
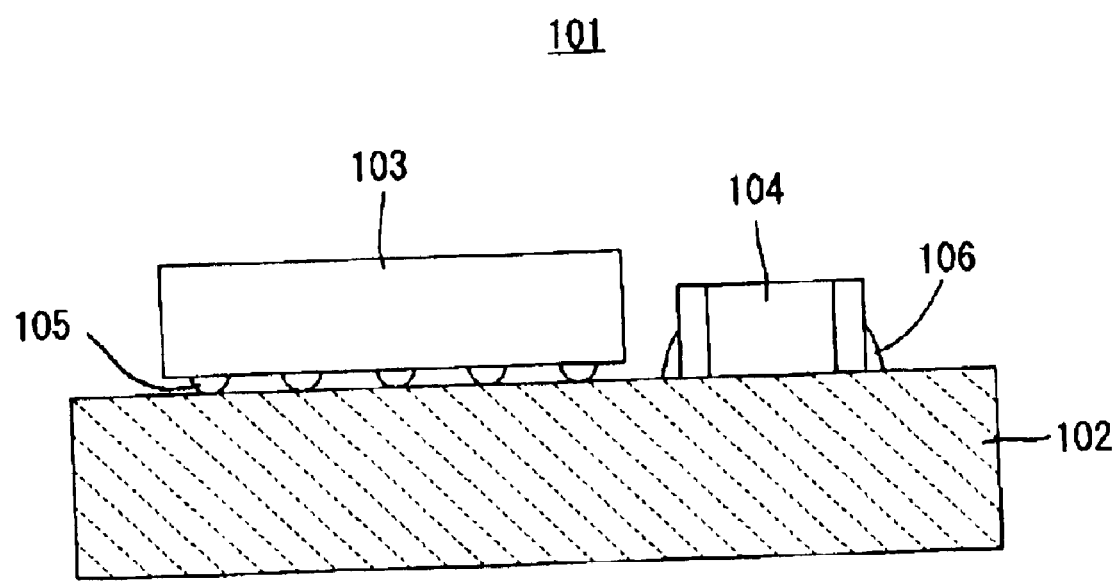
FIG. 8 is a cross-sectional view schematically showing a conventional electronic device.

FIGS. 6A and 6B are views schematically showing an electronic device 41 of a fifth preferred embodiment according to the present invention, FIG. 6A is a cross-sectional view of the electronic device 41, and FIG. 6B is a plan view thereof. In order to easily compare the electronic device 41 shown in FIG. 6 to a related electronic device 101 shown in FIG. 8, the basic structure of the electronic device 41 is the same as that of the electronic device 101.

As shown in FIGS. 6A and 6B, the electronic device 41 includes a wiring substrate 42. Although not shown in detail in the figure, the wiring substrate 42 may be a multilayer ceramic substrate including ceramic layers laminated to each other and including passive elements, such as capacitors, inductors, resistors, filters, or delay lines, and wiring conductors. In addition, although not shown in the figures, several terminal electrodes to be connected to a motherboard on which the electronic device 41 is mounted are provided on a peripheral side surface of the wiring substrate 42 or on the bottom surface thereof, and on the top surface of the wiring substrate 42, several conductive lands are provided.

On the top surface of the wiring substrate 42, at least two electronic components 43 and 44 are mounted by soldering.

The electronic component 43 is preferably an IC chip component, such as an RFIC, baseband (BB) IC, or memory, and is soldered to conductive lands provided on the wiring substrate 42 with several solder bumps 45 provided therebetween. The other electronic component 44 is preferably a chip component to be surface-mounted, such as a capacitor, inductor, or quartz oscillator, and is soldered to conductive lands formed on the wiring substrate 42 with a solder fillet 46 formed by soldering.

In this electronic device 41, among a plurality of the electronic components mounted on the wiring substrate 42, the electronic component 43 shown in the figure has the largest planar area, and the electronic component 44 has the second largest planar area.

In this preferred embodiment, the two electronic components 43 and 44 are adhered to each other with an adhesive resin 47. As can be seen in detail in FIG. 6A, this adhesive resin 47 is applied onto the top surfaces of the electronic components 43 and 44 so as not to contact the wiring substrate 42.

The adhesive resin 47 may extend to at least one side surface of the electronic components 43 and 44, but not so as to contact the wiring substrate 42. Even when applied so as to extend to at least one side surface of the electronic components 43 and 44 as described above, for example, the adhesive resin 47 preferably does not contact the solder fillet 46 formed on the side surfaces of the electronic component 44. As a result, the movement of melted solder generated by remelt of the solder fillet 46 is not restricted by the adhesive resin 47, and hence, the generation of short circuiting by solder due to the restriction of the move of this melted solder is prevented.

The adhesive resin 47 in an uncured state is supplied across the electronic components 43 and 44, for example, by a dispenser and is then cured by heating.

As the adhesive resin 47, for example, a thermosetting resin such as an epoxy resin is used, and in order to prevent the resin from flowing down to the wiring substrate 42, in more particular, a material having the composition and properties (viscosity and thixotropic index) similar to those of the adhesive resin 39 is preferably used.

As described above, according to the fifth preferred embodiment, since the two electronic components 43 and 44 are mechanically integrated, even when one of the electronic components 43 and 44 has a weak bonding strength to the wiring substrate 42, the electronic components 43 and 44 are prevented from falling from the wiring substrate 42 and being damaged by impact applied thereto from the outside due to a fall, bending, or other external force on the electronic device 41.

In addition, the mechanically integrated electronic components 43 and 44 provide a reinforcing structure in order to increase the bending strength of the wiring substrate 42. Accordingly, the wiring substrate 42 is prevented from being damaged, for example, broken by impact applied thereto due to a fall, bending, or other external force on the electronic device 41.

The advantages described above are increasingly obtained when the planar areas of the electronic components 43 and 44 are increased. Hence, as in this preferred embodiment, the adhesive resin 47 is preferably applied across the electronic component 43 having the largest planar area and the electronic component 44 having the second largest planar area.

Furthermore, according to this preferred embodiment, as is the third preferred embodiment shown in FIG. 4 described above, when the solder bumps 45 of the electronic component 43 are made, for example, of eutectic solder, and when high temperature solder is used for the solder fillet 46 for soldering the electronic component 44 to the wiring substrate 42, in a solder reflow process for mounting the electronic device 41 on a motherboard, this solder fillet 46 is prevented from being remelted even when the solder bumps 45 are remelted. Hence, since the position of the electronic component 44 with respect to the wiring substrate 42 is reliably maintained, the position of the electronic component 43, which is fixed to the electronic component 44 with the adhesive resin 47 applied therebetween, is also be reliably maintained with respect to the wiring substrate 42. Accordingly, short circuiting between the conductive lands adjacent to each other connected to the solder bumps 45 caused by solder, which is generated by the movement of the electronic component 43 with respect to the wiring substrate 42, is reliably prevented.

In addition, since the adhesive resin 47 is applied so as not to contact the wiring substrate 42, when this electronic device 41 is mounted on an appropriate motherboard by a solder reflow process, the movement of the melted solder generated when the solder bumps 45 and the solder fillet 46 are remelted is not restricted by the adhesive resin 47, and hence short circuiting between different terminals of the electronic components 43 and 44 caused by the solder, which is generated by the restriction of the movement of melted solder, is prevented.

Figure 7A:
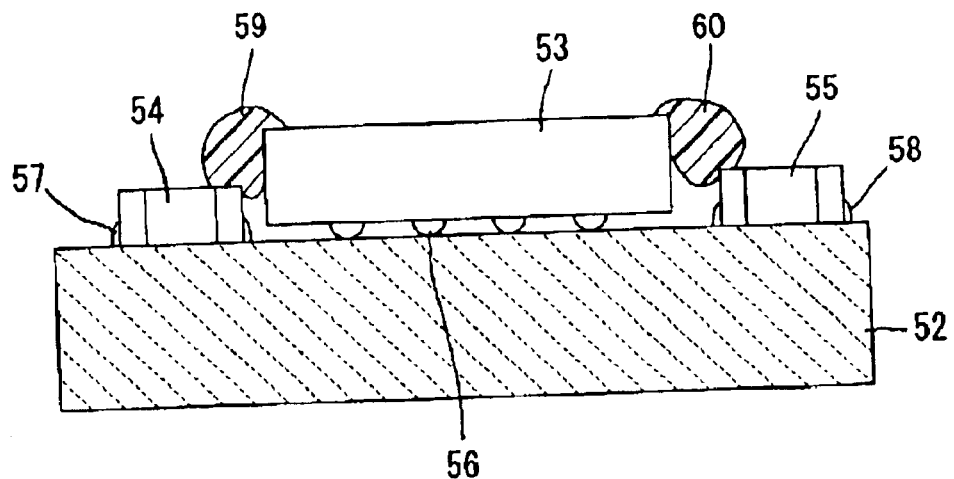
FIG. 7A is a cross-sectional view schematically showing an electronic device of a sixth preferred embodiment according to the present invention.
Figure 7B:
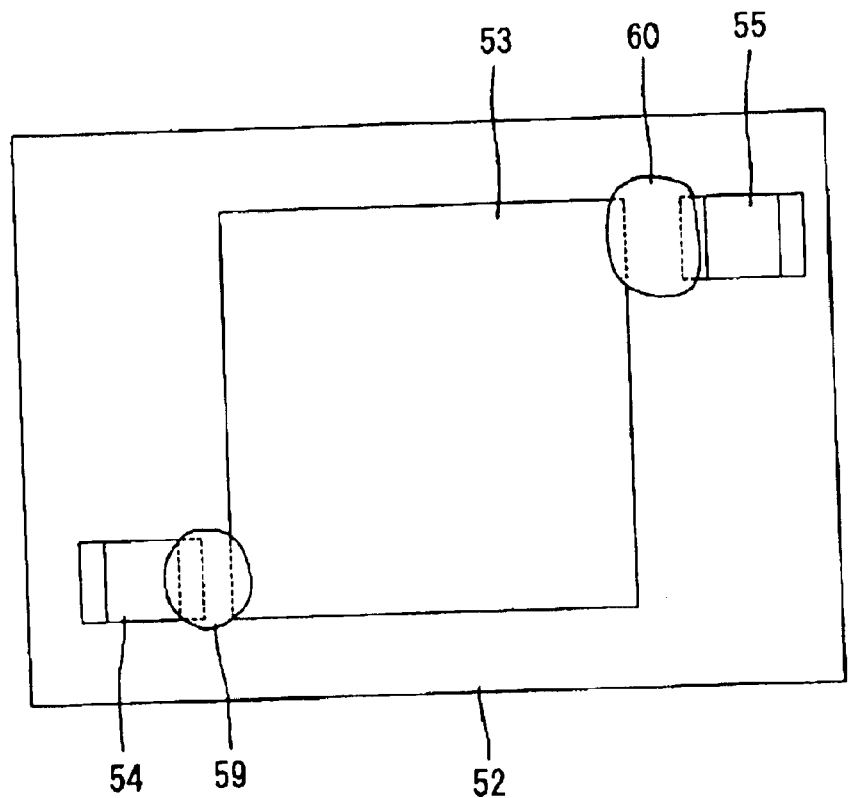
FIG. 7B is a plan view schematically showing the electronic device of the sixth preferred embodiment according to the present invention.

FIGS. 7A and 7B are views each schematically showing an electronic device 51 of a sixth preferred embodiment according to the present invention, FIG. 7A is a cross-sectional view of the electronic device 51, and FIG. 7B is a plan view thereof.

As shown in FIGS. 7A and 7B, the electronic device 51 includes a wiring substrate 52, and on the top surface of the wiring substrate 52, at least a first, a second, and a third electronic component 53, 54, and 55 are provided, in which the second and the third electronic components 54 and 55 are disposed at two opposed sides of the first electronic component 53.

The first electronic component 53 is, for example, an IC chip component and is soldered to the conductive lands provided on the wiring substrate 52 with several solder bumps 56 provided therebetween. The second and the third electronic components 54 and 55 are chip components, such as capacitors, inductors, or quartz oscillators, and are soldered to the wiring substrate 52 with solder fillets 57 and 58, respectively, which are provided therebetween and are formed by soldering.

In this sixth preferred embodiment, the first electronic component 53 and the second electronic component 54 are adhered to each other with an adhesive resin 59, and in addition, the first electronic component 53 and the third electronic component 55 are adhered to each other with an adhesive resin 60.

The adhesive resins 59 and 60 are preferably made of a material having the equivalent composition and properties (viscosity and thixotropic index) to those of the adhesive resin 39 described above.

The rest of the structure is similar to that in the fifth preferred embodiment described above, and hence description thereof is omitted.

In this sixth preferred embodiment, the same advantages as those in the fifth preferred embodiment are obtained, and since the three electronic components 53 to 55 are adhered to each other with the adhesive resins 59 and 60, the total planar area of the electronic components 53 to 55 is greater than that of the electronic components 43 and 44 described above. Thus, the mechanical strength of the electronic device 51 is increased as compared to that in the fifth preferred embodiment.

Heretofore, the present invention has been described with reference to several preferred embodiments, and within the spirit and the scope of the present invention, various modifications may be further performed.

For example, the case 12 shown in FIGS. 1 to 5 is preferably made of a metal. However, the present invention may be applied to an electronic device provided with a resin case.

In addition, the case 12 is fixed to the wiring substrate 2 preferably via soldering using the solder 18. However, in addition to a soldering method, for example, the case may be fixed to the wiring substrate with claws engaged therewith.

The size, shape, and number of openings 21 provided in the case 12 may be optionally changed.

In addition, when the case is not provided with the opening, the adhesive resin may be applied before the case is provided on the wiring substrate, and the electronic component and the case may be adhered to each other by fixing the case to the wiring substrate.

In addition, as long as it is primarily composed of a resin component, the adhesive resin may include a pigment such as carbon, a curing agent, and other suitable additives as described above.

The electronic components 6 to 9, 26, 27, 30, 31, 35, 36, 43, 44, and 53 to 55 are preferably bump (ball) grid array electronic components each provided with solder bumps or surface-mountable electronic components each provided with electrodes at the end portions thereof. Alternatively, land grid array electronic components or electronic components provided with input/output terminals at side surfaces thereof may also be used.

In addition, the number of the electronic components adhered to each other with the adhesive resin and mounted on the wiring substrate is preferably two to three in the preferred embodiments shown in the figures. However, the number of the electronic components may be four or more.

As has thus been described, according to preferred embodiments of the present invention, since the first and the second units provided on the wiring substrate are mechanically integrated, even when one of the first and the second units has a weak bonding strength to the wiring substrate, these units are prevented from being damaged or falling from the wiring substrate by impact applied thereto.

The first and the second units that are mechanically integrated as described above advantageously define a reinforcing structure which improves the bending strength of the wiring substrate. Accordingly, damage, such as breakage, to the wiring substrate caused by impact applied thereto due to a fall or bending is effectively prevented. In addition, when being reinforced, the wiring substrate is unlikely to be bent, and hence units, which are not adhered with an adhesive resin, do not fall from the wiring substrate and are not damaged.

In preferred embodiments of the present invention, when the first unit includes an electronic component mounted on the wiring substrate via soldering, the second unit includes a case fixed to the wiring substrate so as to cover the electronic component, and the adhesive resin is applied on the top surface of the electronic component and the bottom surface of the top wall of the case, since the electronic component and the case are adhered to each other with the adhesive resin, the fixing strength of fixing the case to the wiring substrate is greatly improved. Accordingly, even when impact due to a fall or other external force is applied, the case is unlikely to fall or be removed from the wiring substrate.

In addition, with the adhesive resin applied between the electronic component and the case, each of the gaps between the case and the electronic component and the wiring substrate are maintained constant, and the change in characteristics caused by a change in the gaps described above is prevented.

In addition, according to preferred embodiments of the present invention, since the adhesive resin is applied so as not to contact the wiring substrate, even when heat applied in a solder reflow process is conducted to the solder used for mounting the electronic component on the wiring substrate, and this solder is melted, the solder is prevented from easily flowing so as to cause short circuiting between terminal electrodes of the electronic component. That is, when the adhesive resin is applied so as to contact the wiring substrate and cover the electronic component, the solder for mounting the electronic component is melted and expanded in a solder reflow process, stress is applied to the resin covering the electronic component, and as a result, interface separation occurs between the resin and the wiring substrate. When interface separation occurs, the solder flows in the portion at which the interface separation occurs and causes short circuiting between different terminal electrodes of the electronic component mounted on the wiring substrate. In contrast, in preferred embodiments of the present invention, when the adhesive resin is applied so as not to contact the wiring substrate, the problems described above are prevented.

In addition, since the adhesive resin is applied inside the case, the flatness of the top surface of the case is not deteriorated. Accordingly, in addition to the improvement in mechanical strength, when the electronic device of preferred embodiments of the present invention is mounted on a motherboard, holding of the electronic component can be reliably performed, for example, by vacuum chuck, and hence the reliability of a mounting step is greatly improved.

In preferred embodiments of the present invention, when the opening for supplying the adhesive resin from the outside is provided in the top wall of the case, after the case is fixed to the wiring substrate, the adhesive resin is easily supplied between the electronic component and the case. Accordingly, if an electronic device is rejected as a defective before the adhesive resin is supplied, the electronic component can be removed from the wiring substrate for reuse, and in particular, an expensive electronic component such as an IC chip component can be advantageously reused.

When the opening described above is sealed with the adhesive resin, foreign materials are prevented from intruding into the case through the opening. In particular, in the case in which a tightly sealed space is formed inside the case, when the opening is sealed with the adhesive resin, the sealing properties do not deteriorate. In addition, when the opening is sealed with the adhesive resin, a suction position for a suction nozzle of a mounting machine is freely selected in a mounting step without any restrictions on the position of the opening.

When the opening is provided at a position shifted from the center of the top wall of the case toward the peripheral side thereof, a relatively large area at the central portion of the case can be used for marking, and in addition, the opening can be used as a mark to indicate the directionality of the device. In this case, when the adhesive resin includes a pigment such as carbon, the opening is colored such that the difference in color from the case is more visible, and as a result, the mark described above is more effectively obtained.

When the adhesive resin is applied across a plurality of electronic components, the positional relationship of the electronic components is ensured, and for example, in a solder reflow process, even when solder for mounting the electronic component is melted, the individual electronic components are prevented from moving independently, and as a result, changes in the properties of the electronic device are minimized.

When the top surface of the electronic component has at least a resin portion, and the adhesive resin is applied on this resin portion for adhesion, and the adhesion strength between the adhesive resin and the electronic component is greatly improved.

When the case is made of metal, the shielding effect is obtained by the case. Accordingly, in particular, the present invention is advantageously applied to a high-frequency electronic device. In addition, since the case made of metal can be fixed to the wiring substrate by soldering, specifically designed portions such as claws used for fixing and an assembly step thereof are not required, and hence reduction in component cost and assembly cost is achieved.

In the case in which a third unit is disposed between the sidewall of the case and the wiring substrate, when a space is provided between the sidewall and the third unit, the case is prevented from contacting the third unit even if the fixing position of the case is undesirably shifted, and hence the third unit is prevented from being damaged. In addition, the fixing strength of fixing the case to the wiring substrate is not decreased.

When the adhesive resin is applied to the top surface of the electronic component, which has the largest area, the adhesive resin in an uncured state is prevented from flowing down along a side surface of the electronic component, and hence the adhesive resin is more easily prevented from contacting the wiring substrate.

When the adhesive resin is applied to the top surface of an electronic component which has the largest height, the electronic component and the case are adhered to each other even with a small amount of the adhesive resin, and hence the adhesive resin in an uncured state is more easily prevented from flowing down along a side surface of the electronic component.

In addition, according to the electronic device of preferred embodiments of the present invention, where the first and the second electronic components are provided, in which the first electronic component is adhered to the case with the first adhesive resin, and in which the first electronic component and the second electronic component are adhered to each other with the second adhesive resin, when a material having a low viscosity and a low thixotropic index in an uncured state is used as the first adhesive resin as compared to those of the second adhesive resin, the first adhesive resin is likely to smoothly spread along the top surface of the first electronic component, and the second adhesive resin is reliably prevented from flowing down to the wiring substrate.

According to preferred embodiments of the present invention, where the first and the second units are the first and the second electronic components mounted on the wiring substrate via soldering, and the electronic device of the present invention is mounted on an appropriate motherboard by a solder reflow process, even when the solder connecting the electronic component and the wiring substrate is melted, this electronic component is prevented from moving by the other electronic component adhered thereto with the adhesive resin. In addition, short circuiting caused by the solder due to the movement of the electronic component as described above is effectively prevented.

In preferred embodiments of the present invention, when one of the first and the second electronic components adhered to each other with the adhesive resin is an IC chip component having the largest area of electronic components mounted on the wiring substrate, the mechanical strength of the electronic device described above is more effectively improved. In addition, when the other electronic component adhered to the electronic component having the largest plane area as described above has the second largest plane area of the electronic components mounted on the wiring substrate, the effect described above is further improved.

In addition, when the first, the second, and the third electronic components are provided, the second and the third electronic components being disposed at two opposed sides of the first electronic component, and the first electronic component is adhered to the second and the third components with the adhesive resins, the entire planar area of the first to the third electronic components is relatively increased, and hence the effect of improving the mechanical strength of the electronic device is further improved.

In preferred embodiments of the present invention, in addition to the first and the second electronic components adhered to each other by the adhesive resin, when the case fixed to the wiring substrate to cover the above electronic components is further provided, and the adhesive resin is also applied to this case, since the electronics components mechanically integrated with the adhesive resin is also integrated with the case, the effect of improving the mechanical strength of the electronic device is further improved.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. An electronic device comprising:

a wiring substrate;

a first unit and a second unit which are mounted on the wiring substrate; the first unit includes at least one surface mount electronic component which is mounted on the wiring substrate via solder;

the second unit includes a case which is fixed to the wiring substrate so as to cover the at least one surface mount electronic component;

an adhesive resin which adheres the first unit to the second unit;

a third unit disposed between wiring substrate and a bottom surface of a sidewall of the case; wherein the adhesive resin is not in contact with the surface of the wiring substrate;

the adhesive resin is provided between the top surface of the at least one surface mount electronic component and the bottom surface of the top wall of the case; and a space is provided between the bottom surface of the sidewall of the case and the third unit.

2. An electronic device according to claim 1, wherein the top wall of the case is provided with an opening for supplying the adhesive resin from outside.

3. An electronic device according to claim 2, wherein the opening is sealed with the adhesive resin.

4. An electronic device according to claim 2, wherein the opening is provided at a position shifted from the center of the top wall of the case.

5. An electronic device according to claim 1, wherein the first unit includes a plurality of the electronic components, and the adhesive resin is provided across said plurality of the electronic components.

6. An electronic device according to claim 1, wherein the top surface of the at least one surface mount electronic component includes at least one resin portion, and the adhesive resin is provided on at least one resin portion.

7. An electronic device according to claim 1, wherein the case is made of a metal.

8. An electronic device according to claim 7, wherein the case is fixed to the wiring substrate with solder.

9. An electronic device according to claim 1, further comprising a plurality of electronic components, wherein top surfaces of the electronic components have areas that are different from each other, and the adhesive resin is provided on at least the top surface of one of the electronic components having the largest area.

10. An electronic device according to claim 1, further comprising a plurality of electronic components, wherein the plurality of electronic components have heights that are different from each other, and the adhesive resin is provided on at least the top surface of one of the electronic components having the largest height.

11. An electronic device according to claim 1, wherein the at least one surface mount electronic component includes a first electronic component and a second electronic component, the adhesive resin includes a first adhesive resin for adhering the first electronic component to the case and a second adhesive resin for adhering the first electronic component to the second electronic component, and the first adhesive resin and the second adhesive resin have compositions that are different from each other.

12. An electronic device according to claim 11, wherein the first adhesive resin, in an uncured state, has a lower viscosity and a lower thixotropic index as compared to those of the second adhesive resin.

13. An electronic device according to claim 1, wherein the first unit includes a first surface mount electronic component, the second unit includes a second surface mount electronic component, and the first and the second surface mount electronic components are mounted on the wiring substrate with solder.

14. An electronic device according to claim 13, wherein one of the first electronic component and the second electronic component adhered thereto with the adhesive resin has the largest planar area of the electronic components mounted on the wiring substrate.

15. An electronic device according to claim 14, wherein the electronic component having the largest planar area is an IC chip component.

16. An electronic device according to claim 14, wherein the other electronic component adhered to the electronic component having the largest planar area has the second largest planar area of the electronic components mounted on the wiring substrate.

17. An electronic device according to claim 13, wherein one of the first and the second units further includes a third surface mount electronic component mounted on the wiring substrate via soldering, the second and the third electronic components are arranged at two opposed sides of the first electronic component opposing each other, and the first electronic component is adhered to the second and the third electronic components with the adhesive resin.

18. An electronic device according to claim 13, further comprising a case fixed to the wiring substrate so as to cover the first and the second electronic components, wherein the adhesive resin is adhered to the case.

19. An electronic device according to claim 18, wherein the case has a top wall provided with an opening for supplying the adhesive resin from the outside.

* * * * *